(12) United States Patent
Bonafede et al.

(10) Patent No.: US 10,157,880 B2
(45) Date of Patent: Dec. 18, 2018

(54) MICRO-TRANSFER PRINTING WITH VOLATILE ADHESIVE LAYER

(71) Applicant: X-Celeprint Limited, Cork (IE)

(72) Inventors: Salvatore Bonafede, Chapel Hill, NC (US); Matthew Meitl, Durham, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/718,636

(22) Filed: Sep. 28, 2017

(65) Prior Publication Data

US 2018/0096964 A1   Apr. 5, 2018

Related U.S. Application Data

(60) Provisional application No. 62/403,427, filed on Oct. 3, 2016.

(51) Int. Cl.
*H01L 23/52* (2006.01)
*H01L 23/00* (2006.01)
(Continued)

(52) U.S. Cl.
CPC ........ *H01L 24/83* (2013.01); *H01L 21/67144* (2013.01); *H01L 21/6835* (2013.01);
(Continued)

(58) Field of Classification Search
CPC .............. H01L 23/83; H01L 21/67144; H01L 21/6835; H01L 24/32; H01L 24/81; H01L 33/0079; H01L 33/62
(Continued)

(56) References Cited

U.S. PATENT DOCUMENTS 5,475,224 A   12/1995 Koh
5,621,555 A    4/1997 Park
(Continued)

FOREIGN PATENT DOCUMENTS

JP          2011066130 A    3/2011
WO     WO-2008/036837 A2    3/2008
(Continued)

OTHER PUBLICATIONS

Cok, R. S. et al., AMOLED displays with transfer-printed integrated circuits, Journal of the SID, 19(4):335-341 (2011).
(Continued)

*Primary Examiner* — Luan C Thai
(74) *Attorney, Agent, or Firm* — William R. Haulbrook; Michael D. Schmitt; Choate, Hall & Stewart LLP

(57) ABSTRACT

A method of making a micro-transfer printed structure includes providing a destination substrate and a source substrate having one or more micro-transfer printable components. A layer of volatile adhesive is formed over the destination substrate and one or more components are micro-transfer printed from the source substrate onto the volatile adhesive layer at a non-evaporable temperature of the volatile adhesive layer. The volatile adhesive layer is then heated to an evaporation temperature to evaporate at least a portion of the volatile adhesive after micro-transfer printing. In certain embodiments, a micro-transfer printed structure includes a destination substrate having one or more metal contacts and one or more micro-transfer printable components having one or more component contacts disposed on the destination substrate with the metal contact aligned with the component contact. The metal contact can form an intermetallic bond with the component contact.

21 Claims, 13 Drawing Sheets

(51) Int. Cl.
*H01L 21/683* (2006.01)
*H01L 33/62* (2010.01)
*H01L 33/00* (2010.01)
*H01L 21/67* (2006.01)

(52) U.S. Cl.
CPC .............. *H01L 24/32* (2013.01); *H01L 24/81* (2013.01); *H01L 33/0079* (2013.01); *H01L 33/62* (2013.01); *H01L 24/97* (2013.01); *H01L 2221/68363* (2013.01); *H01L 2221/68368* (2013.01); *H01L 2224/16225* (2013.01); *H01L 2224/16507* (2013.01); *H01L 2224/32225* (2013.01); *H01L 2224/32227* (2013.01); *H01L 2224/32503* (2013.01); *H01L 2224/81002* (2013.01); *H01L 2224/8121* (2013.01); *H01L 2224/8181* (2013.01); *H01L 2224/8182* (2013.01); *H01L 2224/81097* (2013.01); *H01L 2224/81192* (2013.01); *H01L 2224/81409* (2013.01); *H01L 2224/81411* (2013.01); *H01L 2224/81413* (2013.01); *H01L 2224/81439* (2013.01); *H01L 2224/81444* (2013.01); *H01L 2224/81447* (2013.01); *H01L 2224/81455* (2013.01); *H01L 2224/81815* (2013.01); *H01L 2224/81907* (2013.01); *H01L 2224/83002* (2013.01); *H01L 2224/832* (2013.01); *H01L 2224/838* (2013.01); *H01L 2224/8321* (2013.01); *H01L 2224/8381* (2013.01); *H01L 2224/8382* (2013.01); *H01L 2224/83097* (2013.01); *H01L 2224/83192* (2013.01); *H01L 2224/83409* (2013.01); *H01L 2224/83411* (2013.01); *H01L 2224/83413* (2013.01); *H01L 2224/83416* (2013.01); *H01L 2224/83439* (2013.01); *H01L 2224/83444* (2013.01); *H01L 2224/83447* (2013.01); *H01L 2224/83455* (2013.01); *H01L 2224/83469* (2013.01); *H01L 2224/83801* (2013.01); *H01L 2224/83815* (2013.01); *H01L 2224/83907* (2013.01); *H01L 2224/83948* (2013.01); *H01L 2224/95136* (2013.01); *H01L 2924/12041* (2013.01); *H01L 2924/14* (2013.01); *H01L 2933/0066* (2013.01)

(58) Field of Classification Search
USPC ......................................................... 257/783
See application file for complete search history.

(56) References Cited

U.S. PATENT DOCUMENTS

| | | | |
|---|---|---|---|
| 5,815,303 | A | 9/1998 | Berlin |
| 5,882,532 | A | 3/1999 | Field et al. |
| 6,142,358 | A | 11/2000 | Cohn et al. |
| 6,278,242 | B1 | 8/2001 | Cok et al. |
| 6,577,367 | B2 | 6/2003 | Kim |
| 6,717,560 | B2 | 4/2004 | Cok et al. |
| 6,756,576 | B1 | 6/2004 | McElroy et al. |
| 6,933,532 | B2 | 8/2005 | Arnold et al. |
| 7,129,457 | B2 | 10/2006 | McElroy et al. |
| 7,195,733 | B2 | 3/2007 | Rogers et al. |
| 7,288,753 | B2 | 10/2007 | Cok |
| 7,354,801 | B2 | 4/2008 | Sugiyama et al. |
| 7,521,292 | B2 | 4/2009 | Rogers et al. |
| 7,557,367 | B2 | 7/2009 | Rogers et al. |
| 7,586,497 | B2 | 9/2009 | Boroson et al. |
| 7,622,367 | B1 | 11/2009 | Nuzzo et al. |
| 7,662,545 | B2 | 2/2010 | Nuzzo et al. |
| 7,704,684 | B2 | 4/2010 | Rogers et al. |
| 7,799,699 | B2 | 9/2010 | Nuzzo et al. |
| 7,816,856 | B2 | 10/2010 | Cok et al. |
| 7,893,612 | B2 | 2/2011 | Cok |
| 7,927,976 | B2 | 4/2011 | Menard |
| 7,932,123 | B2 | 4/2011 | Rogers et al. |
| 7,943,491 | B2 | 5/2011 | Nuzzo et al. |
| 7,972,875 | B2 | 7/2011 | Rogers et al. |
| 7,982,296 | B2 | 7/2011 | Nuzzo et al. |
| 7,999,454 | B2 | 8/2011 | Winters et al. |
| 8,029,139 | B2 | 10/2011 | Ellinger et al. |
| 8,039,847 | B2 | 10/2011 | Nuzzo et al. |
| 8,198,621 | B2 | 6/2012 | Rogers et al. |
| 8,207,547 | B2 | 6/2012 | Lin |
| 8,261,660 | B2 | 9/2012 | Menard |
| 8,334,545 | B2 | 12/2012 | Levermore et al. |
| 8,394,706 | B2 | 3/2013 | Nuzzo et al. |
| 8,440,546 | B2 | 5/2013 | Nuzzo et al. |
| 8,470,701 | B2 | 6/2013 | Rogers et al. |
| 8,502,192 | B2 | 8/2013 | Kwak et al. |
| 8,506,867 | B2 | 8/2013 | Menard |
| 8,664,699 | B2 | 3/2014 | Nuzzo et al. |
| 8,686,447 | B2 | 4/2014 | Tomoda et al. |
| 8,722,458 | B2 | 5/2014 | Rogers et al. |
| 8,754,396 | B2 | 6/2014 | Rogers et al. |
| 8,766,970 | B2 | 7/2014 | Chien et al. |
| 8,791,474 | B1 | 7/2014 | Bibl et al. |
| 8,794,501 | B2 | 8/2014 | Bibl et al. |
| 8,803,857 | B2 | 8/2014 | Cok |
| 8,817,369 | B2 | 8/2014 | Daiku |
| 8,835,940 | B2 | 9/2014 | Hu et al. |
| 8,854,294 | B2 | 10/2014 | Sakariya |
| 8,877,648 | B2 | 11/2014 | Bower et al. |
| 8,889,485 | B2 * | 11/2014 | Bower .................. H01L 21/563 257/737 |
| 8,895,406 | B2 | 11/2014 | Rogers et al. |
| 8,934,259 | B2 * | 1/2015 | Bower .................. H01L 21/563 257/782 |
| 8,987,765 | B2 | 3/2015 | Bibl et al. |
| 9,142,468 | B2 | 9/2015 | Bower et al. |
| 9,161,448 | B2 | 10/2015 | Menard et al. |
| 9,434,150 | B2 | 9/2016 | Bower et al. |
| 9,520,537 | B2 | 12/2016 | Bower et al. |
| 9,601,356 | B2 | 3/2017 | Bower et al. |
| 2003/0141570 | A1 | 7/2003 | Chen et al. |
| 2006/0079010 | A1 | 4/2006 | Hara et al. |
| 2007/0032089 | A1 | 2/2007 | Nuzzo et al. |
| 2007/0173034 | A1 | 7/2007 | Tsurume et al. |
| 2007/0281556 | A1 | 12/2007 | Elliott et al. |
| 2008/0079246 | A1 | 4/2008 | Dix |
| 2008/0108171 | A1 | 5/2008 | Rogers et al. |
| 2009/0202089 | A1 | 8/2009 | Zhang et al. |
| 2010/0248484 | A1 | 9/2010 | Bower et al. |
| 2010/0306993 | A1 | 12/2010 | Mayyas et al. |
| 2010/0317132 | A1 | 12/2010 | Rogers et al. |
| 2012/0228669 | A1 | 9/2012 | Bower et al. |
| 2012/0314388 | A1 | 12/2012 | Bower et al. |
| 2013/0069275 | A1 | 3/2013 | Menard et al. |
| 2013/0088416 | A1 | 4/2013 | Smith et al. |
| 2013/0196474 | A1 | 8/2013 | Meitl et al. |
| 2013/0207964 | A1 | 8/2013 | Fleck et al. |
| 2013/0221355 | A1 | 8/2013 | Bower et al. |
| 2013/0273695 | A1 | 10/2013 | Menard et al. |
| 2014/0104243 | A1 | 4/2014 | Sakariya et al. |
| 2014/0264763 | A1 | 9/2014 | Meitl et al. |
| 2014/0267683 | A1 | 9/2014 | Bibl et al. |
| 2014/0340900 | A1 | 11/2014 | Bathurst et al. |
| 2014/0367633 | A1 | 12/2014 | Bibl et al. |
| 2015/0028362 | A1 | 1/2015 | Chan et al. |
| 2015/0135525 | A1 | 5/2015 | Bower |
| 2015/0137153 | A1 | 5/2015 | Bibl et al. |
| 2015/0371874 | A1 | 12/2015 | Bower et al. |
| 2016/0020131 | A1 | 1/2016 | Bower et al. |
| 2016/0086855 | A1 | 3/2016 | Bower et al. |
| 2016/0093600 | A1 | 3/2016 | Bower et al. |
| 2017/0047306 | A1 | 2/2017 | Meitl et al. |
| 2017/0154819 | A1 | 6/2017 | Bower et al. |

(56) References Cited

U.S. PATENT DOCUMENTS

2017/0173852 A1    6/2017  Moore et al.
2017/0256521 A1*  9/2017  Cok ..................... H01L 25/165

FOREIGN PATENT DOCUMENTS

WO    WO-2008/103931 A2    8/2008
WO    WO-2011/123285 A1    10/2011
WO    WO-2015/193435 A1    12/2015

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).
Yaniv et al., A 640×480 Pixel Computer Display Using Pin Diodes with Device Redundancy, 1988 International Display Research Conference, IEEE, CH-2678-1/88:152-154 (1988).

* cited by examiner

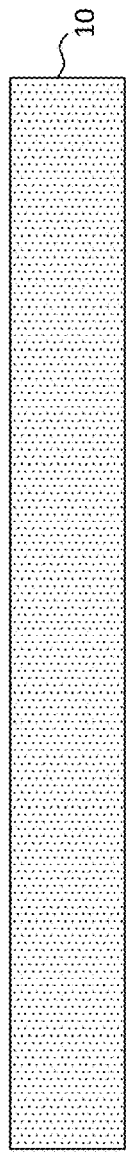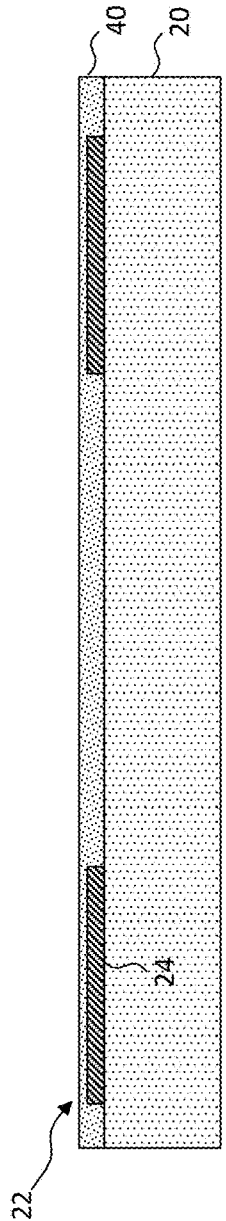

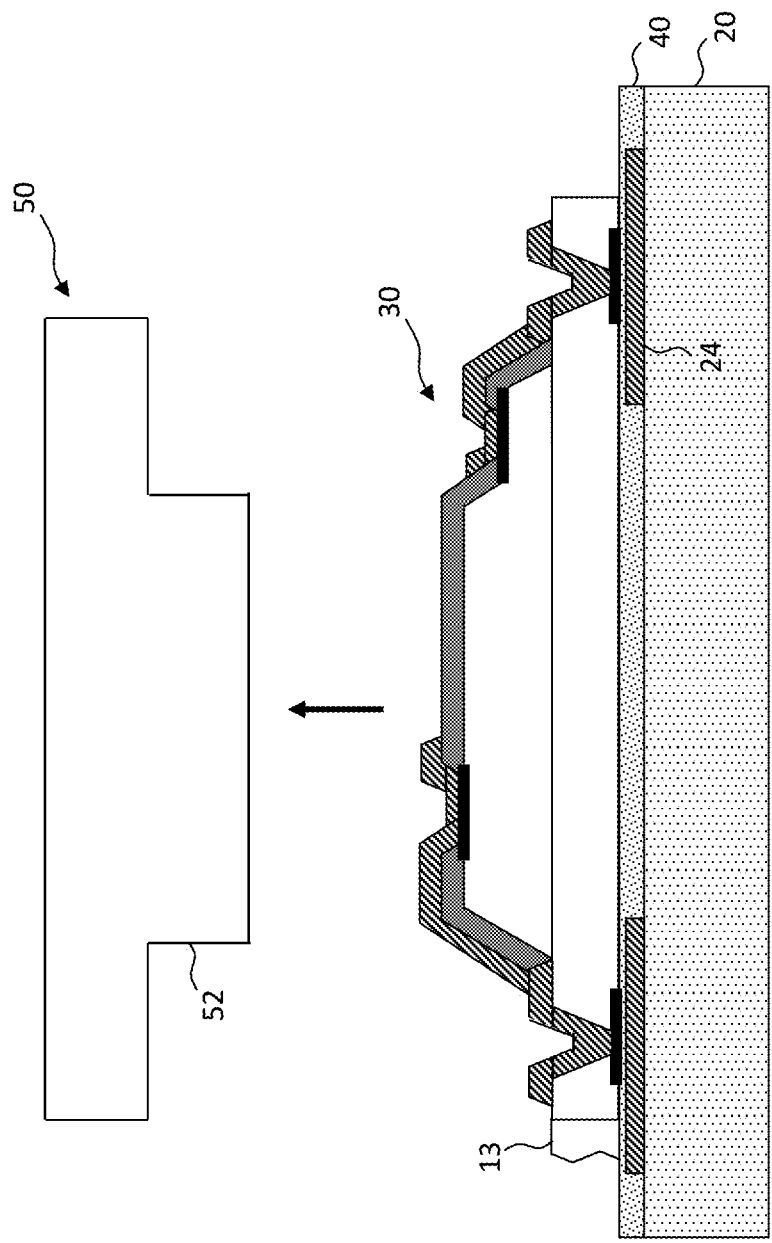

US 10,157,880 B2

MICRO-TRANSFER PRINTING WITH VOLATILE ADHESIVE LAYER

PRIORITY APPLICATION

This application claims the benefit of U.S. Provisional Patent Application No. 62/403,427, filed on Oct. 3, 2016, entitled "Micro-Transfer Printing with Volatile Adhesive Layer," the content of which is hereby incorporated by reference herein in its entirety.

FIELD OF THE INVENTION

The present invention relates to micro-transfer printing processes, materials and structures for use during micro-transfer printing processes, and, in certain embodiments, to use of a layer of volatile adhesive located between a micro-transfer printed component and a target destination substrate.

BACKGROUND OF THE INVENTION

Integrated circuits are formed in wafers of semiconductor materials, such as silicon or compound semiconductors such as GaAs, GaN and the like. The wafers are processed in fabrication clean rooms with processing and handling equipment of a limited size. Thus, there is a maximum upper limit on the size that integrated circuits can have, for example a 450 mm diameter. Similarly, although wafers are diced into small integrated circuits, for example with a diamond saw, there is a lower limit on the size of integrated circuits that can be readily physically handled, for example surface mountable devices having a size of 0.4 mm by 0.2 mm.

Large flat-panel displays typically rely on thin-film semiconductor structures coated on display substrates to provide control signals that control pixels in large-substrate flat-panel displays, for example a 65-inch diagonal rectangular display. However, such thin-film structures have relatively low performance when compared to crystalline semiconductor structures typically used in integrated circuits.

Micro-transfer printing is an alternative method for assembling small high-performance integrated circuits onto large substrates including, but not limited to, for display applications. Micro-transfer printing relies on forming small integrated circuits (chiplets) on a source wafer substrate and then, in one exemplary technique, using silicone elastomer stamps to transfer the chiplets to a target destination substrate, for example as described in U.S. Pat. No. 9,434,150 entitled "Apparatus and Methods for Micro-Transfer-Printing" and issued Sep. 6, 2016. The target destination substrate can range in size from tens of microns to several meters in a dimension. In any micro-transfer printing process, the efficiency and yields of the transfer process are important. For example, the above-referenced U.S. patent describes exposing the transferred integrated circuits to a plasma to improve transfer. However, further improvements in micro-transfer printing yields and efficiency are useful.

There is a need, therefore, for devices, systems and methods for enabling micro-transfer printing with high efficiency and yield.

SUMMARY OF THE INVENTION

Certain embodiments of the present invention provide methods of making a micro-transfer printed structure. The methods comprise providing a destination substrate and a source substrate having one or more micro-transfer printable components, forming a layer of volatile adhesive over the destination substrate, micro-transfer printing one or more components from the source substrate onto the volatile adhesive layer at a non-evaporable temperature of the volatile adhesive layer, and heating the volatile adhesive layer to an evaporation temperature to evaporate the volatile adhesive after micro-transfer printing. A component can be connected to a source substrate by one or more tethers that are broken during micro-transfer printing such that the component comprises one or more broken tethers after micro-transfer printing.

A destination substrate can include one or more electrically conductive metal contacts (e.g., a plurality of spatially separated metal contacts) on which a volatile adhesive layer is formed. In some embodiments, heating an adhesive layer to an evaporation temperature causes at least a portion of each of one or more metal contacts (e.g., a surface layer of a metal contact, a metal component of a metal contact, or a metal contact itself) to melt and enter a liquid or partially liquid state (e.g., a two phase state comprising a liquid). Cooling a metal contact to a temperature at which the any liquid present as a result of heating solidifies can adhere a component to a metal contact. A metal contact can be a designated portion of an unpatterned metal layer or a portion of a patterned metal layer.

In some embodiments of the present invention, a component has a printing surface and a flat opposing surface including one or more electrically conductive component contacts electrically connected to electrical elements in the component. Micro-transfer printing the component from a source substrate can include contacting the printing surface with a stamp, releasing the component from the source substrate, and pressing the component contacts to the adhesive layer. The steps of heating and cooling can form an electrical connection between one or more metal contacts and one or more component contacts.

The evaporation process caused by a heating step can render a volatile adhesive gaseous. An evaporation process caused by a heating step can drive an adhesive through the surface of and into a destination substrate or drive the adhesive through the surface of and into a component, or both. Adhesive can diffuse into a metal contact, diffuse into a component contact, or diffuse into both the metal contact and the component contact. For example, adhesive can diffuse spontaneously during heating. In some embodiments, a material of a metal contact (e.g., a metal) diffuses into a component contact or a material (e.g., a metal) of a component contact diffuses into the metal contact, or both. For example, diffusion can occur spontaneously during heating. A material of a metal contact can wet a component contact when a portion of a metal contact melts (e.g., at least partially enters a liquid state). For example, wetting can occur spontaneously during heating. A volatile adhesive layer can be patterned or unpatterned.

A component can include a plurality of component contacts. A component contact and a metal contact can each be one or more of a solderable material, a metal alloy, and a metal alloy including one or more of gold, tin, lead, bismuth, indium, nickel, silver, platinum, and copper. A component contact can be, for example, one or more of a semiconductor, a compound semiconductor, silicon, GaAs, InGaAs, InP, GaN, and InGaN.

In some embodiments of the present invention, a component can have at least one of a length, a width and a height dimension less than or equal to one micron, two microns, five microns, ten microns, twenty microns, fifty microns, or one hundred microns.

In some embodiments, a micro-transfer printed structure includes a destination substrate having one or more metal contacts and one or more micro-transfer printable components having one or more component contacts disposed on the destination substrate with the metal contact aligned with the component contact. At least one metal contact can form an intermetallic bond with a component contact (e.g., due to heating). One or more metal contacts can form an electrical connection to a component contact. For example, each metal contact can form at least one of (i) an intermetallic bond and (ii) an electrical connection with a component contact (e.g., with a one to one correspondence). In some embodiments, a micro-transfer printed structure comprises an adhesive that is at least partially diffused into one or more metal contacts, one or more component contacts, or both. A metal contact can include a material (e.g., metal) that is diffused into a component contact or a component contact can include a material (e.g., metal) that is diffused into a metal contact, or both. A metal contact can include metal that contacts the surface of a component contact to form an electrical connection or electrical contact.

Certain embodiments of the present invention provide improved adhesion between a micro-transfer printed component and a destination target substrate and improved electrical connections between metal contacts on the destination target substrate and component contacts on the micro-transfer printed component.

In one aspect, the disclosed technology includes a method of making a micro transfer printed structure, comprising: providing a destination substrate; providing a source substrate comprising one or more micro-transfer printable components; forming a layer of volatile adhesive over the destination substrate; micro-transfer printing one or more of the one or more micro-transfer printable components from the source substrate onto the volatile adhesive layer at a non-evaporable temperature of the volatile adhesive layer; and heating the volatile adhesive layer to an evaporation temperature to evaporate at least a portion of the volatile adhesive after micro-transfer printing.

In some embodiments, the volatile adhesive layer is patterned. In some embodiments, the volatile adhesive layer is unpatterned.

In some embodiments, heating the volatile adhesive layer renders at least a portion of the volatile adhesive gaseous.

In some embodiments, heating the volatile adhesive layer drives at least a portion of the adhesive through the surface of and into at least one of (i) the destination substrate and (ii) the component. In some embodiments, diffusing a portion of the adhesive into the one or more metal contacts.

In some embodiments, the one or more micro-transfer printed components each comprise one or more electrically conductive component contacts. In some embodiments, the method comprises providing one or more electrically conductive metal contacts disposed on, in, or over the destination substrate.

In some embodiments, each metal contact is one or more of a solderable material, a metal alloy, and a metal alloy comprising at least one of gold, tin, lead, bismuth, indium, nickel, silver, platinum, and copper.

In some embodiments, the forming step comprises forming the volatile adhesive layer on the one or more metal contacts; the heating step causes at least a portion of at least one of the one or more metal contacts to melt; and the method comprises cooling the at least one metal contact to a temperature at which the at least a portion of the at least one metal contact solidifies in order to adhere at least one of the one or more components to the at least one metal contact.

In some embodiments, the one or more metal contacts are one or more designated portions of an unpatterned metal layer or one or more portions of a patterned metal layer. In some embodiments, each of the one or more micro-transfer printed components has a printing surface and a flat opposing surface and comprises one or more electrically conductive component contacts electrically connected to electrical elements in the component, the micro-transfer printing step comprises contacting each printing surface with a stamp, releasing each component from the source substrate, and pressing each component contact of the one or more micro-transfer printed components to the adhesive layer, and wherein the steps of heating and cooling form an electrical connection between the at least one metal contact and one or more of the component contacts of the one or more micro-transfer printed components.

In some embodiments, each of the component contacts are one or more of a semiconductor, a compound semiconductor, silicon, GaAs, InGaAs, InP, GaN, and InGaN.

In some embodiments, the method comprises diffusing at least one of (i) a material of one or more of the one or more metal contacts into one or more of the component contact(s) of the one or more micro-transfer printed components and (ii) a material of one or more of the component contact(s) diffuses into the metal contact.

In some embodiments, the method comprises wetting a component contact of the one or more micro-transfer printed components with material of the one or more metal contacts. In some embodiments, the method comprises diffusing adhesive into the one or more component contacts.

In some embodiments, the method comprises providing one or more electrically conductive metal contacts disposed on, in, or over the destination substrate, wherein the forming step comprises forming the volatile adhesive layer on the one or more metal contacts; the heating step causes at least a portion of at least one component contact to melt; and the method comprises cooling the at least one component contact to a temperature at which the at least a portion of the at least one component solidifies in order to adhere at least one of the one or more components to the at least one metal contact.

In some embodiments, micro-transfer printing comprises, for each micro-transfer printable component being micro-transfer printed, breaking one or more tethers that connect the micro-transfer printable component to the source substrate.

In some embodiments, the component has at least one of a length, width and height dimension that is less than or equal to one micron, less than or equal to two microns, less than or equal to five microns, less than or equal to ten microns, less than or equal to twenty microns, less than or equal to fifty microns, or less than or equal to one hundred microns.

In one aspect, the disclosed technology includes a micro-transfer printed structure, comprising: a destination substrate comprising one or more metal contacts; and one or more micro-transfer printed components each comprising one or more component contacts, the one or more micro-transfer printed components disposed on the destination substrate with the one or more metal contacts aligned with the one or more component contacts, wherein the one or more metal contacts form an intermetallic bond with the one or more component contacts of the one or more micro-transfer printed components.

In some embodiments, the structure comprises an adhesive that is diffused into at least one of the one or more metal contacts and the one or more component contacts of the one or more micro-transfer printed components.

In some embodiments, at least one of (i) the one or more metal contacts comprise metal that is diffused into the component contact and (ii) the one or more component contacts of the one or more micro-transfer printed components comprise a material that is diffused into the metal contact. In some embodiments, the one or more metal contacts comprise metal that contacts the surface of the one or more component contacts of the one or more micro-transfer printed components.

In some embodiments, each of the one or more micro-transfer printed components comprises a broken tether.

In one aspect, the disclosed technology includes a method of making a micro transfer printed structure, comprising: providing a destination substrate comprising one or more electrically conductive metal contacts; providing a source substrate comprising one or more micro-transfer printable components, each component comprising one or more electrically conductive component contacts; forming a layer of volatile adhesive over the destination substrate; micro-transfer printing one or more micro-transfer printable components from the source substrate onto the volatile adhesive layer at a non-evaporable temperature of the volatile adhesive layer such that the component contact(s) of the one or more micro-transfer printable components micro-transfer printed from the source substrate are in alignment with and adhered to the one or more metal contacts; heating the volatile adhesive layer to an evaporation temperature to evaporate the volatile adhesive after micro-transfer printing; and cooling the component(s) and metal contact(s) to adhere the one or more components micro-transfer printed from the source substrate to the one or more metal contacts and form an electrical connection between the one or more metal contacts and the component contact(s) of the one or more micro-transfer printed components micro-transfer printed from the source substrate.

In some embodiments, the one or more metal contacts form corresponding intermetallic bond(s) with the component contact.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 3A-3H are sequential cross sections of structures made in an exemplary method in accordance with some illustrative embodiments of the present invention;

Figure 1:
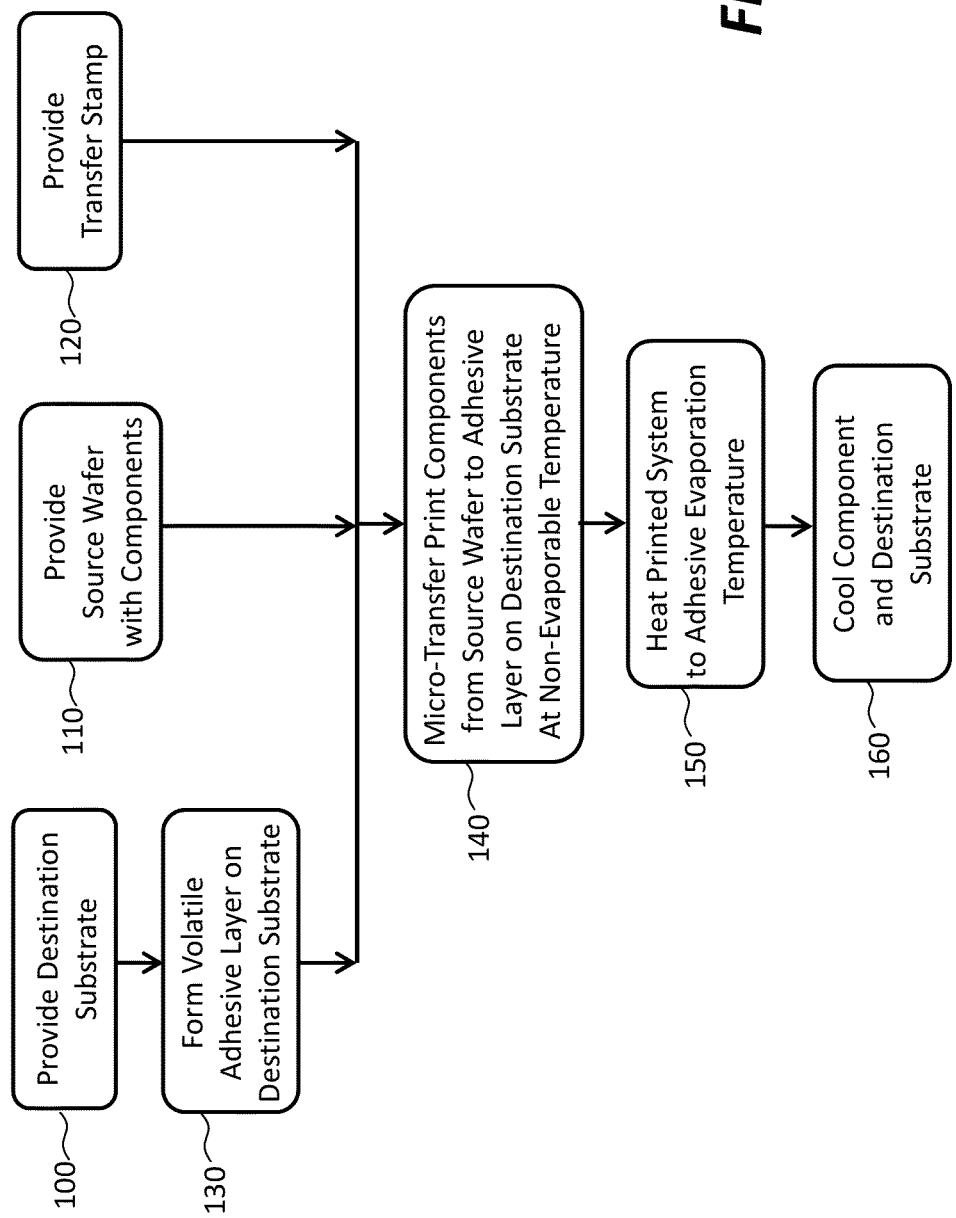
FIG. 1 is a flow diagram illustrating an exemplary method in accordance with some illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2:
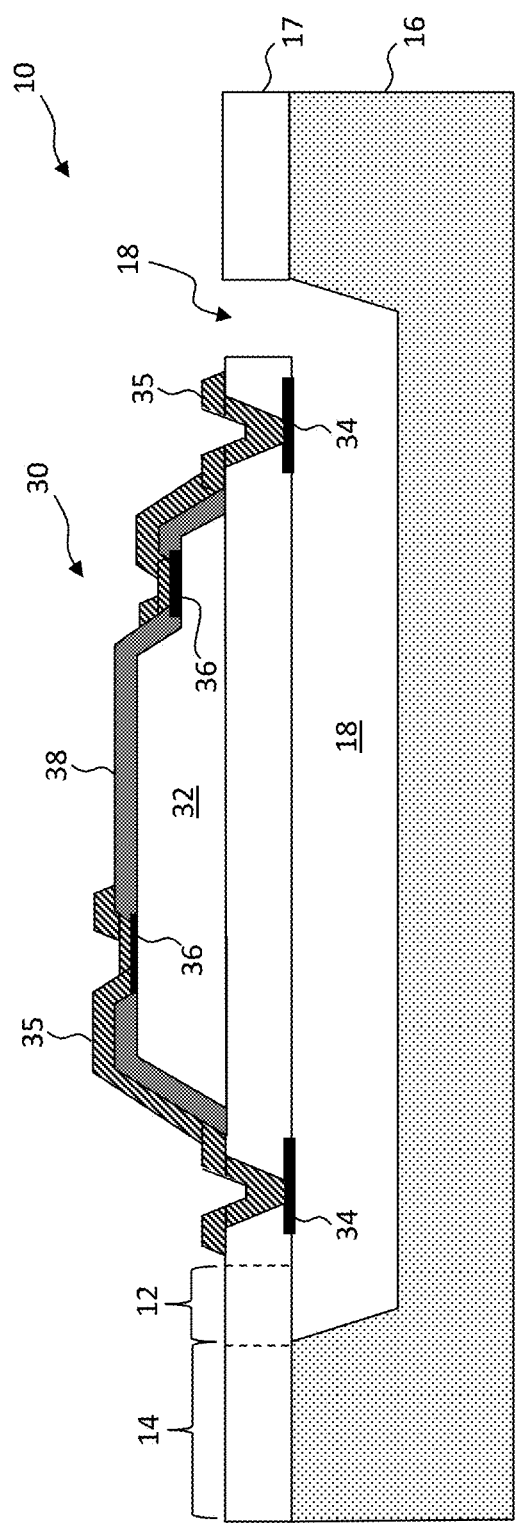
FIG. 2 is a cross section of a component source wafer according to some illustrative embodiments of the present invention.
Figure 3D:
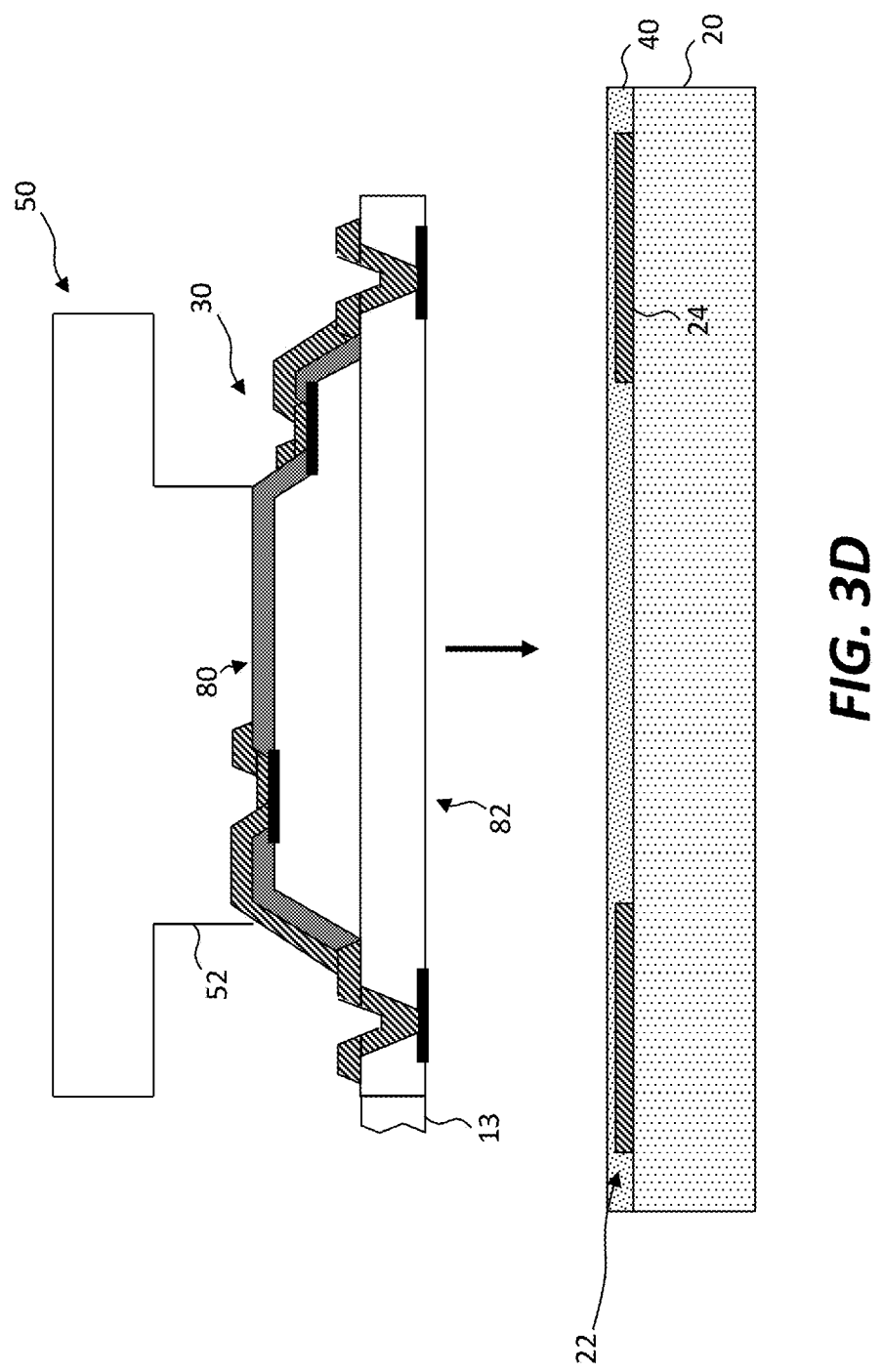

Referring to FIG. 1, FIG. 2, FIGS. 3A-3H, and FIG. 4, an exemplary method of making a micro-transfer printed structure 70 in accordance with some embodiments of the present invention includes providing a destination substrate 20 (illustrated in FIG. 3A) in step 100 and a source wafer 10 having a substrate 16 with one or more micro-transfer printable components 30 (as illustrated, for example, in FIG. 2, where one micro-transfer printable component is shown) in step 110. A patterned metal layer 22 with one or more electrically conductive metal contacts 24 can be formed on, in, or over a surface of the destination substrate 20 (illustrated in FIG. 3B). As shown in FIG. 3B, metal contacts 24 can be spatially separated over the surface of a destination substrate 20. Alternatively, a metal layer 22 can be formed as an unpatterned metal layer 22 or the metal contacts 24 can be a designated portion of an unpatterned metal layer 22 (not shown). In some embodiments, the metal layer 22 (patterned or unpatterned) can be provided with the destination substrate 20 in step 100.

A destination substrate 20 can be any substrate with two substantially flat and parallel sides, for example, a glass, plastic, resin, or ceramic sheet as is found in the display, semiconductor, or printed circuit board arts. A metal layer 22 can be formed using photolithographic or printed circuit board methods and materials, for example, by laminating, sputtering, or evaporating a metal layer 22 onto a destination substrate 20. A metal layer 22 can be patterned to form metal contacts 24 using conventional photolithographic methods including coating a photosensitive polymer (e.g., a photoresist) over an unpatterned metal layer 22, exposing the photosensitive polymer using a mask, developing the exposed photosensitive polymer to expose a pattern on the metal layer 22, etching the exposed portions of the metal layer 22 to form a patterned metal layer 22, and removing residual photosensitive polymer. In an alternative lift-off method, a photosensitive polymer is applied over a destination substrate 20, patterned using a mask, and developed to remove a portion of the polymer. A metal layer 22 is provided over the destination substrate 20 and the remaining photosensitive polymer. The remaining photosensitive polymer is removed together with the portions of the metal layer 22 disposed on the remaining photosensitive polymer, for example, by using a solvent to which the photosensitive polymer is susceptible, leaving a corresponding patterned metal layer 22 on the destination substrate 20. The metal layer 22 or any patterned metal contacts 24 can be one or more of a solderable material, a metal alloy, and a metal alloy including one or more of gold, tin, lead, bismuth, indium, nickel, silver, platinum, and copper. Thus, metal contacts 24 can be alloys, can include different metals, or can have multiple layers of different materials such as metals.

Figure 4:
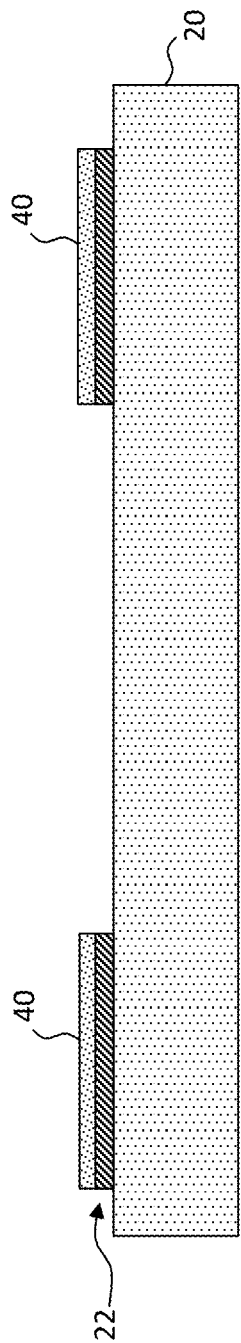
FIG. 4 is a cross section of alternative destination substrate layers according to some illustrative embodiments of the present invention.

A layer 40 of volatile adhesive is formed over the destination substrate 20 in step 130. The volatile adhesive layer 40 can be patterned (as shown in FIG. 4), or unpatterned (as shown in FIG. 3C) and can be formed over the metal layer 22 or patterned metal contacts 24. A volatile adhesive layer 40 can be patterned over metal contacts 24 only (as shown in FIG. 4) or additionally over areas on a destination substrate 20 between the metal contacts 24 (as shown in FIG. 3C). A volatile adhesive layer 40 is a layer of material that is adhesive and remains in place at a relatively lower non-evaporable temperature but evaporates or otherwise leaves the layer at a relatively higher evaporation temperature. Accordingly, a non-evaporable temperature is a temperature below an evaporation temperature. For example, a non-evaporable temperature can be room temperature for a particular adhesive layer. A volatile adhesive 40 can be, for example, polyethylene glycol (PEG) (e.g., having a molecular weight ranging from 100 to 600 g/mol) diluted with one or more solvents. For example, useful solvents can be alcohols such as methanol, ethanol, or isopropyl alcohol. A volatile adhesive 40 can originate in a solution state and can be disposed on or over a metal layer 22 or destination substrate 20, for example by curtain, spin, or spray coating a solution of volatile adhesive 40, and subsequently drying the volatile adhesive 40 on the destination substrate 20 by allowing the solvent(s) (e.g., alcohol) to evaporate, for example at room temperature. The remaining volatile adhesive 40 provides an adhesive layer having, for example, a thickness of 1 to 10 nm, 10 to 100 nm, 100 to 500 nm, or larger.

Figure 3E:
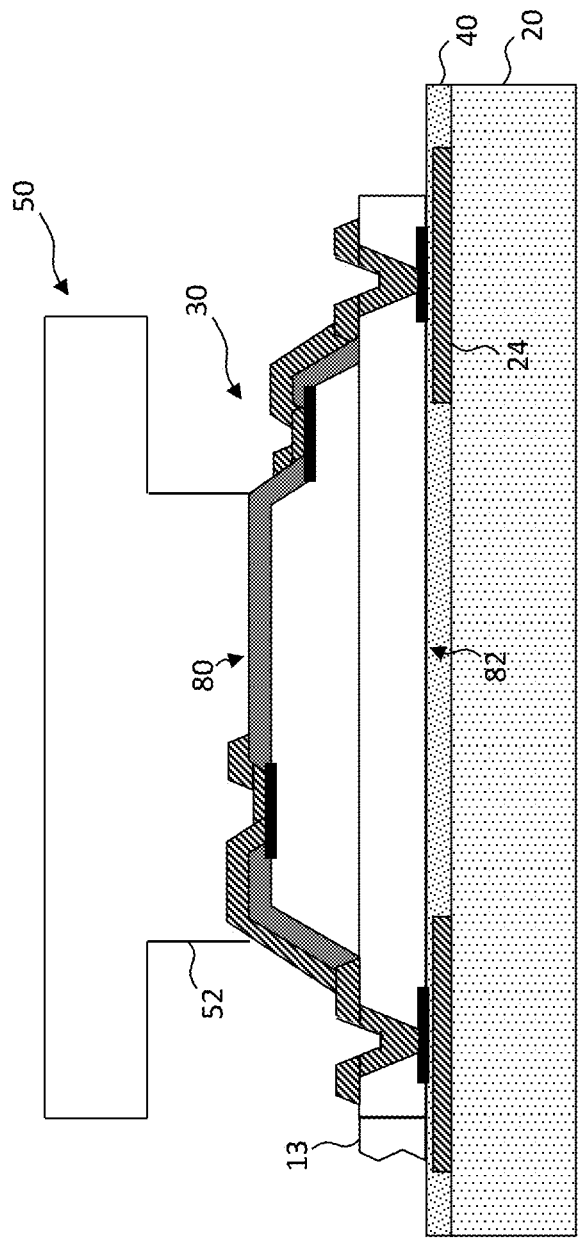

With reference to FIG. 3D, a micro-transfer printing stamp 50 is provided in step 120 and can be an elastomeric stamp 50 formed using photolithographic processes. Certain useful photolithographic processes are described, for example, in U.S. patent application Ser. Nos. 14/804,031, 14/975,041 and 14/918,174, the disclosures of which are incorporated by reference herein. A micro-transfer printing stamp 50 includes one or more stamp posts 52 that, during micro-transfer printing, are each located in contact with a component 30 on a component source wafer 10 (as illustrated in FIG. 2) and pressed against the component 30 to break (e.g., fracture) one or more tethers 12 connecting the component 30 to an anchor 14 of the source wafer substrate 16. The component 30 with one or more broken tethers 13 adheres to the stamp post 52 and is transported to, and in alignment with, the destination substrate 20 and any metal contacts 24 (as shown in FIG. 3D) on the destination substrate 20. The stamp 50 then presses the component(s) 30 with the broken tether 13 onto the volatile adhesive layer 40 on the destination substrate 20 in alignment with the metal contacts 24 while the volatile adhesive layer 40 is at a relatively lower non-evaporable temperature to micro-transfer print the component(s) 30 onto the volatile adhesive layer 40. This micro-transfer printing process occurs in step 140 (as shown in FIG. 3E). The stamp 50 is then removed (as shown in FIG. 3F).

Figure 3G:
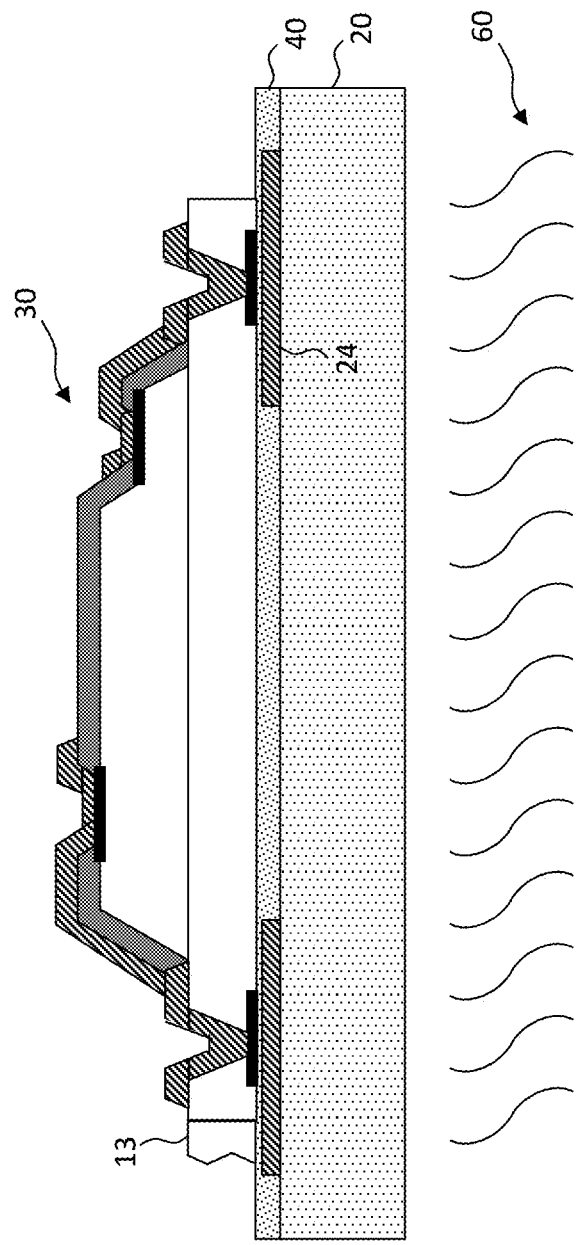
Figure 3H:
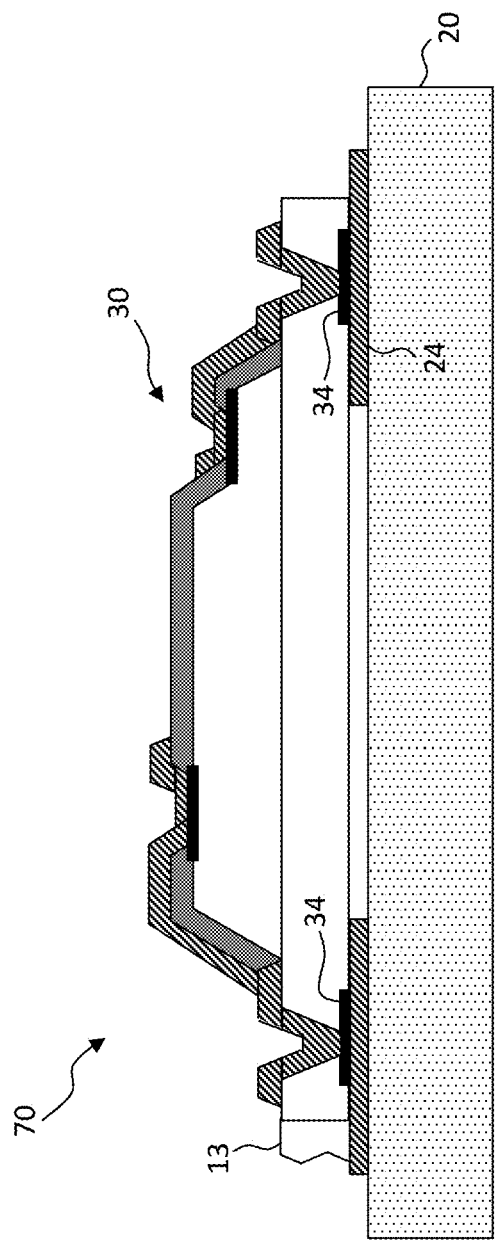

In step 150, and as illustrated in FIG. 3G, heat 60 is applied to the printed structure and to the volatile adhesive layer 40 so that the volatile adhesive layer 40 is heated to a relatively higher, adhesive evaporation temperature, for example by baking in an oven or placing the destination substrate 20 and micro-transfer printed structure on a hotplate or by providing electromagnetic energy that is absorbed by the volatile adhesive layer 40, for example, from a laser, microwave, or other electromagnetic energy source. A printed system can be heated to a temperature at or above the adhesive evaporation temperature, for example to also melt at least a portion of at least one of a metal contact and a component contact (e.g., a surface layer of a metal contact 24 or component contact 34, a metal component in a metal contact 24 or component contact 34, or a metal contact 24 or component contact 34 itself). Thus, a metal or a metal layer in or on a metal contact 24 or component contact 34 can become at least partially liquid and at least partially wet the metal contact 24 or component contact 34. In response to heat 60 exceeding an evaporation temperature, a volatile adhesive in the layer 40 at least partially evaporates, leaving component(s) 30 adhered to a destination substrate 20 (as shown in FIG. 3H). In some embodiments, a volatile adhesive 40 can sublime directly from a solid state to a gaseous state. In some embodiments, a volatile adhesive 40 can melt into a liquid state and subsequently into a gaseous state. Using a volatile adhesive 40 is useful for temporarily adhering the component 30 to a destination substrate 20 (e.g., to metal contacts 24 disposed thereon) and for formation of permanent electrical bonds and/or permanent physical bonds between the metal or component contacts 24, 34, as a result of heating. Heating can occur at elevated temperatures above room temperature (e.g., exceeding an evaporation temperature), for example, at or exceeding 100° C., 110° C., 120° C., 150° C. or 160° C. or above. The selected temperature can depend on the volatile adhesive material 40 and also on the component or metal contact 34, 24 material selections. The component 30 and destination substrate 20 are then cooled in step 160 and put into use. Thus, according to some embodiments of the present invention, a component 30 with component contacts 34 can be aligned with, disposed upon, and electrically connected to electrical contacts (e.g., metal contacts 24) coated with a volatile adhesive 40 on a destination substrate 20 by micro-transfer printing the components 30 in alignment with the electrical contacts 24 onto the destination substrate 20 and heating the printed structure without the need for subsequent processing, for example subsequent photolithographic processing in a vacuum chamber, thereby reducing manufacturing equipment needs, costs, and steps.

According to some embodiments of the present invention, the evaporation process of step 150 (FIG. 3G) renders the volatile adhesive gaseous, evaporates the volatile adhesive 40 into the local environment, drives the adhesive through the surface of and into the destination substrate 20, drives the volatile adhesive 40 through the surface of and into the component 30, drives the volatile adhesive 40 through the surface of and into the component 30 and through the surface of and into the destination substrate 20, or any combination thereof. In some embodiments, volatile adhesive 40 diffuses into a metal contact 24. Heating a volatile adhesive layer 40 to a temperature greater than or equal to the evaporation temperature (as in step 150) can cause at least a portion of a metal contact 24 to melt, such as the metal contact 24 itself, a metal component (e.g., material) of the metal contact 24, or a surface layer of the metal contact 24. When the destination substrate 20 and component 30 are then cooled, the metal contact 24 solidifies to adhere and bond a component 30 to the metal contact 24. Likewise, at least a portion of a component contact 34 can be similarly melted (e.g., by melting the component contact itself, a metal component (e.g., material) of the component contact, or a surface layer of component contact) and solidified to adhere and bond a component 30 to a destination substrate 20 (e.g., to at least one metal contact of the destination substrate). In some embodiments, both at least a portion of a metal contact 24 and at least a portion of a component contact 34 are melted and solidified by heating and cooling, respectively, in order to adhere and bond a component 30 to a destination substrate 20. In some embodiments, both at least a portion of a metal contact 24 and at least a portion of a component contact 34 melt and are subsequently solidified in order to adhere and bond a component 30 to a destination substrate 20.

In some embodiments of the present invention, a component 30 has a printing surface 80 and a flat opposing surface 82 including one or more electrically conductive component contacts 34 electrically connected to electrical elements 32 in the component 30 through element contacts 36. Component contacts 34 can be or include, for example, one or more of a semiconductor, a compound semiconductor, silicon, GaAs, InGaAs, InP, GaN, and InGaN. In some embodiments, micro-transfer printing a component 30 from a substrate 16 of a source wafer 10 (as in step 140) includes contacting the printing surface 80 with a stamp 50, releasing the component 30 from the source wafer substrate 16, and pressing component contacts 34 on the opposing surface 82 of the component 30 to a volatile adhesive layer 40 (as shown in FIG. 3E). Heating and subsequent cooling (e.g., as in steps 150, 160) forms an electrical connection between one or more of the metal contacts 24 and one or more of the component contacts 34.

In some embodiments, a heating process (e.g., step 150) causes a material of a metal contact 24 to diffuse into a component contact 34. Alternatively, a material of the component contact 34 diffuses into the metal contact 24. In some embodiments, both a material of the metal contact 24 diffuses into the component contact 34 and a material of the component contact 34 diffuses into the metal contact 24. A material of a metal contact 24 can wet a component contact 34, particularly when a surface layer of the metal contact 24, a metal component of the metal contact 24, or the metal contact 24 is in a melted state (i.e., at least partially liquid state), as described above. In some embodiments, a volatile adhesive 40 can diffuse into a component contact 34, a metal contact 24, or into both the metal contact 24 and the component contact 34.

An electrical connection electrically connects an element 32 of a component 30, through an element contact 36, to a metal contact 24 of a destination substrate 20 and, in some embodiments, to an external electrical power or signal source (not shown) electrically connected to the metal layer 22 or metal contacts 24.

Components 30 can be micro-transfer printed from a source wafer 10 to a target destination substrate 20. Components 30 suitable for micro-transfer printing can be very small, for example having at least one of a length, a width and a height dimension less than or equal to one micron, two microns, five microns, ten microns, twenty microns, fifty microns, or one hundred microns. Such small components 30 are not readily transferred from a native, source wafer 10 to a destination substrate 20 having a different material composition than the components 30 using conventional surface-mount or pick-and-place tools.

In some embodiments of the present invention, as illustrated in FIG. 3H, a micro-transfer printed structure 70 includes a destination substrate 20 having one or more metal contacts 24 and one or more micro-transfer printed components 30 having one or more component contacts 34. The one or more micro-transfer printed components 30 are disposed on the destination substrate 20 so that metal contacts 24 of the destination substrate 20 are aligned with component contacts 34 of the components 30. In some embodiments, each metal contact 24 forms an intermetallic bond and electrical connection with a corresponding component contact 34.

In some embodiments, a micro-transfer printed structure 70 includes a volatile adhesive 40 that is diffused into a metal contact 24, diffused into a component contact 34, or both. Furthermore, in some embodiments, a metal contact 24 includes material (e.g., metal) that is diffused into a component contact 34 or the component contact 34 includes a material that is diffused into the metal contact 24, or both. The metal contact 24 can include metal that contacts the surface of the component contact 34.

Referring again to FIG. 2, components 30 of a source wafer 10 can be made by first providing a source wafer substrate 16 (for example a substrate comprising glass, sapphire, a semiconductor such as silicon, or a compound semiconductor, for example GaN) and patterning a sacrificial layer on or over the source wafer 10 to form an array of sacrificial portions spatially separated by anchors 14. Component contacts 34 (e.g., contact pads) can be patterned over sacrificial portions, such as by patterning an evaporated or sputtered metal layer 22. A dielectric layer 17 can be deposited, for example by sputtering, over a sacrificial layer and component contacts 34. An element 32 can then be formed, for example a patterned semiconductor structure, on or over the dielectric layer 17. Such an element 32 can be an integrated circuit (for example CMOS) or light-emitting diode (LED) and can include electrical element contacts 36. A dielectric layer 38 can be formed to insulate the element 32 and patterned to form vias providing access to element contacts 36 through dielectric layer 38 and component contacts 34 through dielectric layer 17 and to expose a portion of a sacrificial layer. A metal layer 22 is deposited and patterned to form electrodes 35 electrically connecting the element 32 and element contacts 36 to component contacts 34. Sacrificial portions are etched through the exposed portion of the sacrificial layer to form gaps 18 and tethers 12 physically connecting the components 30 to anchors 14 of the source wafer substrate 16. The components 30 can then be micro-transfer printed using a micro-transfer printing stamp 50. Multiple micro-transfer printable components 30 can be formed on a source wafer 10 in common processing steps. All of these steps (except transfer printing) can be performed using standard microfabrication methods and materials, including photolithographic methods and materials.

In certain embodiments, the present invention provides an advantage in that a volatile adhesive layer 40 assists in micro-transfer printing a micro-transfer printable component 30 to a destination substrate 20 by adhering the micro-transfer printed component 30 to the destination substrate 20 (e.g., to the metal contacts 24 thereof) (as in step 140). If not evaporated, a volatile adhesive 40 can increase the resistance of one or more electrical connection between metal contact(s) 24 and component contact(s) 34. In some embodiments, by evaporating a volatile adhesive (as in step 150), the electrical contact between metal contacts 24 and component contacts 34 is improved and contact resistance is decreased. Furthermore, components 30 can be affixed and electrically connected to metal contacts 24 on a destination substrate 20 in a simple atmospheric process. Moreover, bonds formed between metal contacts 24 of a destination substrate 20 and component contacts 34 of components 30 can form an excellent thermal connection for conducting heat from the components 30 to the destination substrate 20, improving operating characteristics of the printed system.

Figure 5:
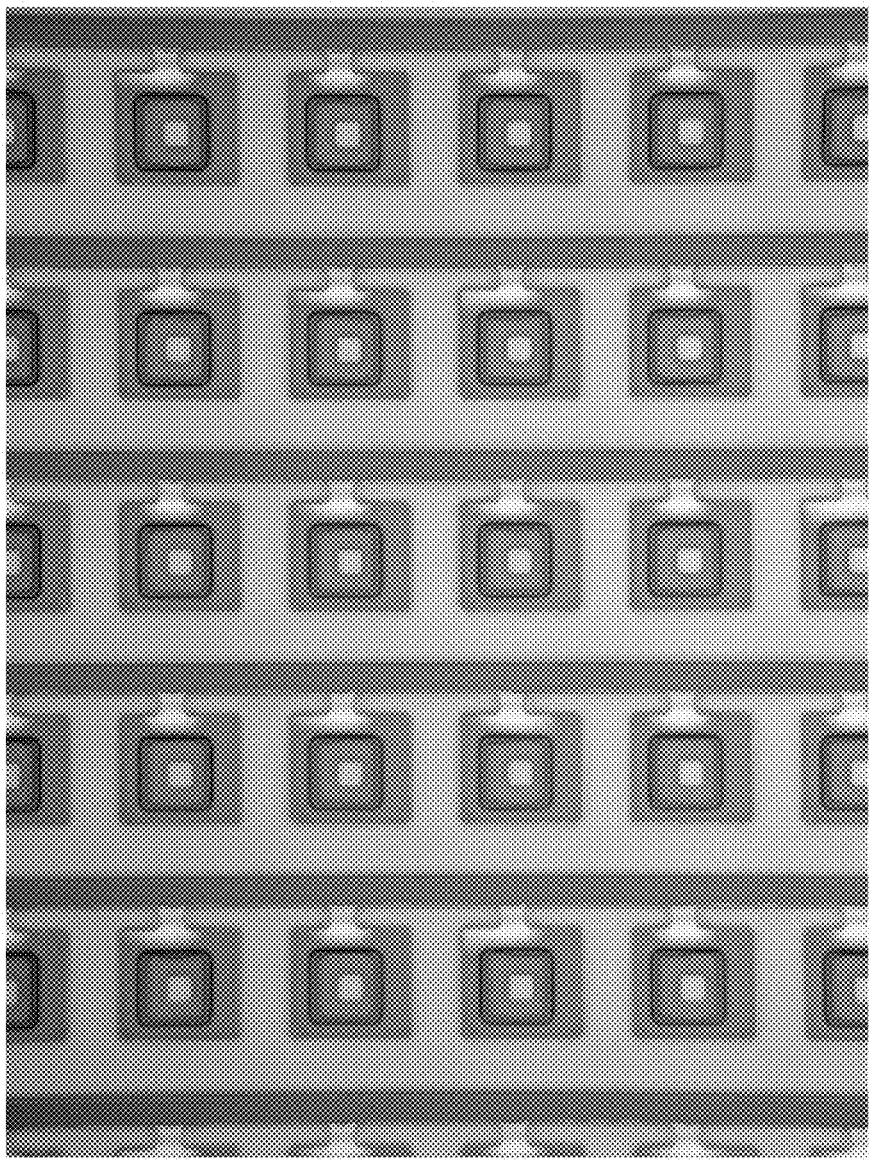
FIGS. 5-8 are micrographs illustrating construction steps according to an exemplary method in accordance with some illustrative embodiments of the present invention.

An exemplary embodiment of the present invention has been constructed and tested, as shown in FIGS. 5-8. In the tested embodiment, the element 32 of the component 30 was a GaAs red-light-emitting inorganic light-emitting diode (LED) having a size of 8 µm by 8 µm by 1 µm and two electrical contacts 36. The component 30 had a single component contact 34 of n-InGaP electrically connected to a first one of the element contacts 36 of the LED element 32. (In contrast components 30 of other figures illustrate two component contacts 34.) A component wafer substrate 16 having components 30 was processed and the components 30 released from the component wafer substrate 16 by etching the sacrificial portions of the source wafer 10 (in accordance with step 110, as shown in FIG. 5).

A destination substrate 20 comprised a 4-inch-diagonal silicon wafer. A Ti (250 Å)/Au (2000 Å)/Sn (500 Å)/Au (200 Å) blanket metal layer 22 was evaporated onto the silicon wafer (in accordance with step 100). A 10 mL methanol/1 mL PEG (400 g/mol molecular weight) volatile adhesive layer 40 was spin coated onto the unpatterned metal layer 22 and dried at room temperature by evaporating the methanol to form a dried volatile adhesive layer 40 (in accordance with step 130).

Figure 6:
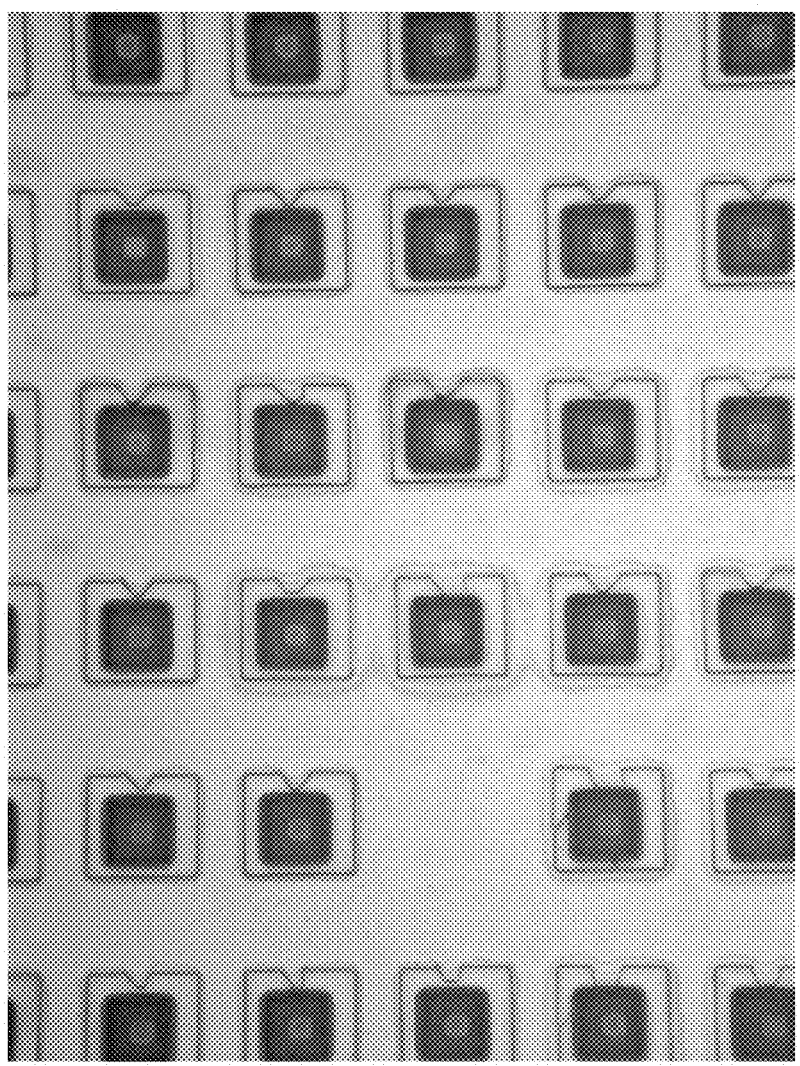
Figure 7:
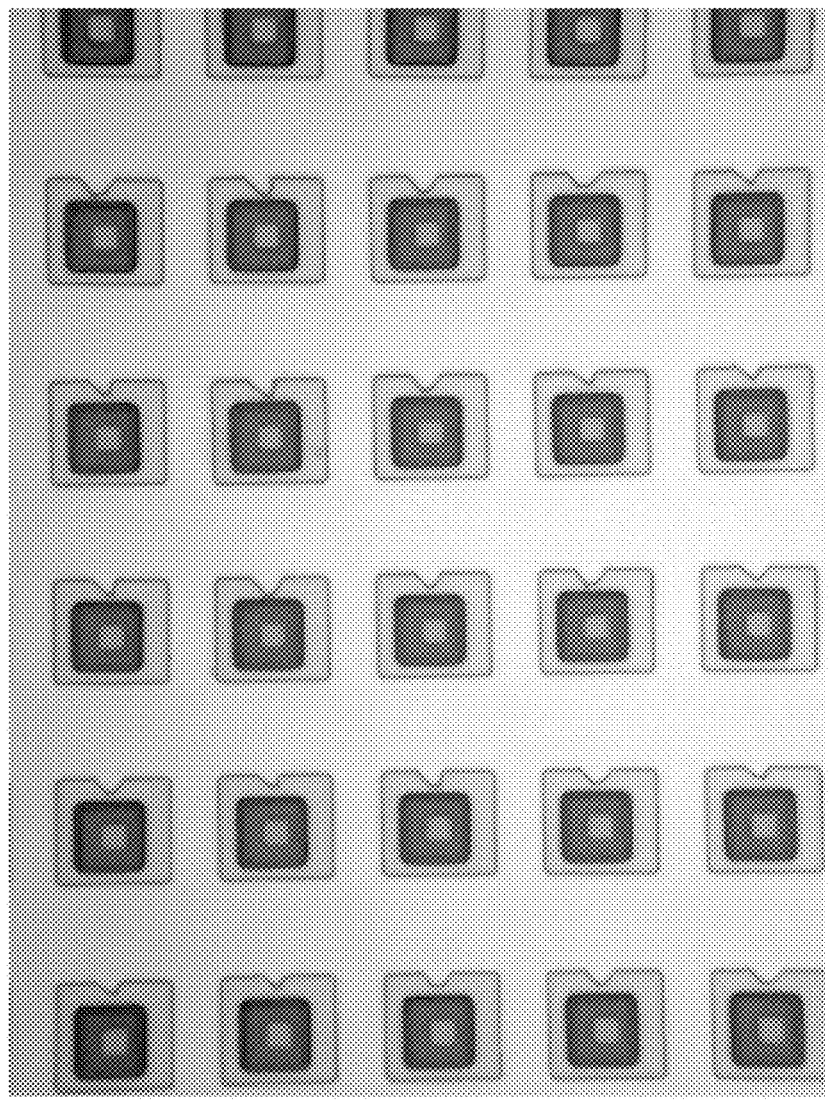

The released components 30 (in accordance with step 110, as shown in FIG. 5) were micro-transfer printed from the wafer substrate 10 onto the volatile adhesive layer 40 and adhered to the metal layer 22 of the destination substrate 20 (in accordance with step 140, as shown in FIG. 6). The micro-transfer printed structure (including destination substrate 20) was thermally treated on a hotplate at 235° C. for one minute (in accordance with step 150) and the exposed volatile adhesive layer 40 was visually observed to evaporate into the atmosphere. The metal contact 24 between the destination substrate 20 and the component 30 melted and incorporated at least a portion of the volatile adhesive 40 and material of the component contact 34. The structure was cooled to room temperature (in accordance with step 160, as shown in FIG. 7), forming an intermetallic bond and electrical connection between the metal layer 22 and the component contact 34.

Figure 8:

A 1.4 µm epoxy layer was spin coated over the structure and cured to form a passivation layer. A portion of the top surface of the passivation layer was removed to expose a portion of the micro-transfer printed LEDs, forming a second element contact 36 and providing a second electrical contact to each LED. A shadow mask was applied to the structure and a metal layer (20 Å Ti, 2500 Å AlZnO) was deposited through the shadow mask to form a patterned electrode providing a second electrical connection to each LED that is electrically separate from the metal layer 22. Electrical power was applied to the metal layer 22 and the patterned (Ti, AlZnO) electrode and the LEDs operated to emit red light (as shown in FIG. 8).

The micro-transfer-printed components 30 were micro-transfer printed to the volatile adhesive layer 40, the components 30 adhered to the metal layer 22, and the volatile adhesive 40 heated and evaporated so that a bond and electrical connection were formed between the LED component contact 34 and the metal layer 22 after the thermal processing. In contrast, when a control system was printed to a destination substrate with no adhesive layer, the components 30 did not adhere to the substrate. Moreover, components 30 printed and adhered to a destination substrate 20 with a non-volatile adhesive layer did not form an electrical contact between the component contacts 34 and the metal layer 22. Rather, the non-volatile adhesive layer formed a non-conductive passivation layer that inhibited electrical conduction between the metal layer 22 and the component contact 34. Thus, the tested embodiment of the present invention demonstrated improved adhesion in combination with improved electrical connections to a destination substrate 20 compared to conventional methods and materials used as a control.

In some embodiments of the present invention, elements 32 or components 30 can be relatively small, for example in some embodiments, each element 32 or component 30 has at least one of a width from 2 to 5 µm, 5 to 10 µm, 10 to 20 µm, or 20 to 50 µm, a length from 2 to 5 µm, 5 to 10 µm, 10 to 20 µm, or 20 to 50 µm, and a height from 2 to 5 µm, 4 to 10 µm, 10 to 20 µm, or 20 to 50 µm. Elements 32 can be integrated circuits, light emitters such as light-emitting diodes, or sensors, such as photo-sensors, magnetic sensors, or electrical-field sensors.

A source wafer 10 can comprise a semiconductor source wafer substrate 16, for example comprising silicon, such as silicon (1 0 0) or silicon (1 1 1), glass, plastic, or other materials suitable for wafers. Sacrificial layers or sacrificial portions can include layers or patterned layers of etchable materials, for example such as oxides or nitrides such as silicon oxide or silicon nitride, or portions of the source wafer substrate 16 that are differentially etchable in different directions (i.e., exhibit anisotropic etching) (for example by taking advantage of the crystalline structure of the source wafer substrate 16 to etch in one direction more rapidly than in another direction).

A destination substrate 20 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. According to some embodiments of the present invention, a destination substrate 20 can include layers formed on an underlying structure or substrate, for example a rigid or flexible glass or plastic substrate. A destination substrate 20 can be transparent (e.g., at least partially transparent) or opaque.

For a discussion of micro-transfer printing techniques useful in embodiments of the present invention see, U.S. Pat. Nos. 8,722,458, 7,622,367 and 8,506,867, the disclosure of each of which is hereby incorporated by reference herein. Some embodiments of the present invention can be applied in compound micro-assembly structures, for example as described in U.S. patent application Ser. No. 14/822,868, filed Aug. 10, 2015, entitled "Compound Micro-Assembly Strategies and Devices", the disclosure of which is hereby incorporated by reference in its entirety. Additional details useful in understanding and performing aspects of the present invention are described in U.S. patent application Ser. No. 14/743,981, filed Jun. 18, 2015, entitled "Micro Assembled LED Displays and Lighting Elements" and in U.S. Pat. No. 9,434,150 entitled "Apparatus and Methods for Micro-Transfer-Printing" and issued Sep. 6, 2016, the disclosures of which are hereby incorporated by reference herein in their entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a sacrificial layer or sacrificial portion is considered "on" a substrate when a layer of sacrificial material or sacrificial portion is on top of the substrate, when a portion of the substrate itself is the sacrificial layer, or when the sacrificial layer or sacrificial portion comprises material on top of the substrate and a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in a method can be conducted simultaneously, in some embodiments. The invention has been described in detail with particular reference to certain embodiments thereof, but it will be understood that variations and modifications can be effected within the spirit and scope of the invention.

PARTS LIST 10 source wafer
12 tether
13 broken tether
14 anchor
16 source wafer substrate
17 dielectric layer
18 gap
20 destination (target) substrate
22 metal layer
24 metal contact
30 component
32 element
34 component contact
35 electrode
36 element contact
38 dielectric
40 volatile adhesive layer/volatile adhesive
50 stamp
52 stamp post
60 heat
70 micro-transfer printed structure
80 printing surface
82 opposing surface
100 provide destination substrate step
110 provide source wafer with components step
120 provide transfer stamp step
130 form volatile adhesive layer on destination substrate step
140 micro-transfer print components from source wafer to adhesive layer on destination substrate at non-evaporable temperature step
150 heat printed system to adhesive evaporation temperature step
160 cool component and destination substrate step

What is claimed:

1. A method of making a micro-transfer printed structure, comprising:
   providing a destination substrate;
   providing a source substrate comprising one or more micro-transfer printable components;
   forming a layer of volatile adhesive over the destination substrate;
   micro-transfer printing one or more of the one or more micro-transfer printable components from the source substrate onto the volatile adhesive layer at a non-evaporable temperature of the volatile adhesive layer; and
   heating the volatile adhesive layer to an evaporation temperature to evaporate at least a portion of the volatile adhesive after micro-transfer printing.

2. The method of claim 1, wherein the volatile adhesive layer is patterned.

3. The method of claim 1, wherein the volatile adhesive layer is unpatterned.

4. The method of claim 1, wherein heating the volatile adhesive layer renders at least a portion of the volatile adhesive gaseous.

5. The method of claim 1, wherein heating the volatile adhesive layer drives at least a portion of the adhesive through the surface of and into at least one of (i) the destination substrate and (ii) the component.

6. The method of claim 1, wherein the one or more micro-transfer printed components each comprise one or more electrically conductive component contacts.

7. The method of claim 1, comprising providing one or more electrically conductive metal contacts disposed on, in, or over the destination substrate.

8. The method of claim 7, wherein each metal contact is one or more of a solderable material, a metal alloy, and a metal alloy comprising at least one of gold, tin, lead, bismuth, indium, nickel, silver, platinum, and copper.

9. The method of claim 7, comprising diffusing a portion of the adhesive into the one or more metal contacts.

10. The method of claim 7, wherein
    the forming step comprises forming the volatile adhesive layer on the one or more metal contacts;
    the heating step causes at least a portion of at least one of the one or more metal contacts to melt; and
    the method comprises cooling the at least one metal contact to a temperature at which the at least a portion of the at least one metal contact solidifies in order to adhere at least one of the one or more components to the at least one metal contact.

11. The method of claim 7, wherein the one or more metal contacts are one or more designated portions of an unpatterned metal layer or one or more portions of a patterned metal layer.

12. The method of claim 10, wherein each of the one or more micro-transfer printed components has a printing surface and a flat opposing surface and comprises one or more electrically conductive component contacts electrically connected to electrical elements in the component, the micro-transfer printing step comprises contacting each printing surface with a stamp, releasing each component from the source substrate, and pressing each component contact of the one or more micro-transfer printed components to the adhesive layer, and wherein the steps of heating and cooling form an electrical connection between the at least one metal contact and one or more of the component contacts of the one or more micro-transfer printed components.

13. The method of claim 12, wherein each of the component contacts are one or more of a semiconductor, a compound semiconductor, silicon, GaAs, InGaAs, InP, GaN, and InGaN.

14. The method of claim 12, comprising diffusing at least one of (i) a material of one or more of the one or more metal contacts into one or more of the component contact(s) of the one or more micro-transfer printed components and (ii) a material of one or more of the component contact(s) diffuses into the metal contact.

15. The method of claim 12, comprising wetting a component contact of the one or more micro-transfer printed components with material of the one or more metal contacts.

16. The method of claim 12, comprising diffusing adhesive into the one or more component contacts.

17. The method of claim 6, comprising:
providing one or more electrically conductive metal contacts disposed on, in, or over the destination substrate, wherein
the forming step comprises forming the volatile adhesive layer on the one or more metal contacts;
the heating step causes at least a portion of at least one component contact to melt; and
the method comprises cooling the at least one component contact to a temperature at which the at least a portion of the at least one component solidifies in order to adhere at least one of the one or more components to the at least one metal contact.

18. The method of claim 1, wherein micro-transfer printing comprises, for each micro-transfer printable component being micro-transfer printed, breaking one or more tethers that connect the micro-transfer printable component to the source substrate.

19. The method of claim 1, wherein the component has at least one of a length, width and height dimension that is less than or equal to one micron, less than or equal to two microns, less than or equal to five microns, less than or equal to ten microns, less than or equal to twenty microns, less than or equal to fifty microns, or less than or equal to one hundred microns.

20. A method of making a micro-transfer printed structure, comprising:
providing a destination substrate comprising one or more electrically conductive metal contacts;
providing a source substrate comprising one or more micro-transfer printable components, each component comprising one or more electrically conductive component contacts;
forming a layer of volatile adhesive over the destination substrate;
micro-transfer printing one or more micro-transfer printable components from the source substrate onto the volatile adhesive layer at a non-evaporable temperature of the volatile adhesive layer such that the component contact(s) of the one or more micro-transfer printable components micro-transfer printed from the source substrate are in alignment with and adhered to the one or more metal contacts;
heating the volatile adhesive layer to an evaporation temperature to evaporate the volatile adhesive after micro-transfer printing; and
cooling the component(s) and metal contact(s) to adhere the one or more components micro-transfer printed from the source substrate to the one or more metal contacts and form an electrical connection between the one or more metal contacts and the component contact(s) of the one or more micro-transfer printed components micro-transfer printed from the source substrate.

21. The method of claim 20, wherein the one or more metal contacts form corresponding intermetallic bond(s) with the component contact.

* * * * *